(12) United States Patent
Cann et al.

(10) Patent No.: US 11,078,122 B2
(45) Date of Patent: Aug. 3, 2021

(54) CERAMIC MATERIAL COMPRISING A PSEUDO-CUBIC PHASE, A PROCESS FOR PREPARING AND USES OF THE SAME

(71) Applicants: David Cann, Corvallis, OR (US);
Brady Gibbons, Corvallis, OR (US);
Peter Mardilovich, Cambridge (GB)

(72) Inventors: David Cann, Corvallis, OR (US);
Brady Gibbons, Corvallis, OR (US);
Peter Mardilovich, Cambridge (GB)

(73) Assignee: XAAR TECHNOLOGY LIMITED, Cambridge (GB)

(*) Notice: Subject to any disclaimer, the term of this patent is extended or adjusted under 35 U.S.C. 154(b) by 0 days.

(21) Appl. No.: 16/483,581

(22) PCT Filed: Feb. 2, 2018

(86) PCT No.: PCT/GB2018/050307
§ 371 (c)(1),
(2) Date: Aug. 5, 2019

(87) PCT Pub. No.: WO2018/142152
PCT Pub. Date: Aug. 9, 2018

(65) Prior Publication Data
US 2020/0010370 A1 Jan. 9, 2020

(30) Foreign Application Priority Data
Feb. 3, 2017 (GB) .................................. 1701828

(51) Int. Cl.
*C04B 35/475* (2006.01)
*C04B 35/49* (2006.01)
(Continued)

(52) U.S. Cl.
CPC .......... *C04B 35/49* (2013.01); *C04B 35/6261* (2013.01); *C04B 35/62645* (2013.01);
(Continued)

(58) Field of Classification Search
CPC .............................. C04B 35/475; C04B 35/49
See application file for complete search history.

(56) References Cited

U.S. PATENT DOCUMENTS

| 8,269,402 B2* | 9/2012 | Yamaguchi | ......... H01L 41/1878 310/358 |
| 9,935,256 B2* | 4/2018 | Nanao | ............... C04B 35/62625 |
| 2016/0093793 A1* | 3/2016 | Nanao | ............... C04B 35/62655 310/365 |

FOREIGN PATENT DOCUMENTS

| CN | 1381425 | 11/2002 |
| CN | 103102154 | 5/2013 |

(Continued)

OTHER PUBLICATIONS

First Chinese Office Action, in corresponding Chinese Application No. 201880010087.7, dated May 19, 2020 (17 pages), and machine translation (9 pages).

(Continued)

*Primary Examiner* — Karl E Group
(74) *Attorney, Agent, or Firm* — Finnegan, Henderson, Farabow, Garrett & Dunner LLP

(57) ABSTRACT

The present invention relates to a bismuth-based solid solution ceramic material, as well as a process for preparing the ceramic material and uses thereof, particularly in an actuator component employed, for example, in a droplet deposition apparatus. In particular, the present invention relates to a ceramic material having a general chemical formula (I): (I): $x(Bi_{0.5}Na_{0.5})TiO_3-y(Bi_{0.5}K_{0.5})TiO_3-z_1SrHfO_3-z_2SrZrO_3$, wherein $x+y+Z_1+Z_2=1$; y, $(z_1+z_2)\neq 0$; $x\geq 0$. In embodiments, the present invention also relates to a ceramic material having a general chemical formula (II): $x(Bi0.5Na0.5)TiO3-y(Bi0.5K0.5)TiO3-y(Bi0.5K0.5)TiO3-ZiSrHfO3-z2SrZrO3$, wherein $x+y+z-i+z2=1$; x, y, fa+z2) $\neq 0$; as well as a ceramic material of general formula (III):

(Continued)

$y(Bi_{0.5}K_{0.5})TiO_3\text{-}z_1SrHfO_3\text{-}z_2SrZrO_3$, wherein $y+z_1+z_2=1$; $y, (z_1+z_2) \neq 0$.

19 Claims, 10 Drawing Sheets

(51) Int. Cl.
    *H01L 41/187*      (2006.01)
    *C04B 35/626*      (2006.01)
    *C04B 35/634*      (2006.01)

(52) U.S. Cl.
CPC ...... *C04B 35/6342* (2013.01); *H01L 41/1873* (2013.01); *H01L 41/1878* (2013.01); *C04B 2235/3201* (2013.01); *C04B 2235/3213* (2013.01); *C04B 2235/3237* (2013.01); *C04B 2235/3249* (2013.01); *C04B 2235/3298* (2013.01); *C04B 2235/604* (2013.01); *C04B 2235/761* (2013.01); *C04B 2235/762* (2013.01); *C04B 2235/765* (2013.01); *C04B 2235/768* (2013.01); *C04B 2235/788* (2013.01); *C04B 2235/79* (2013.01)

(56) References Cited

FOREIGN PATENT DOCUMENTS

| | | |
|---|---|---|
| CN | 103153910 | 6/2013 |
| EP | 2187462 A2 | 5/2010 |
| KR | 20130047875 A | 5/2013 |
| KR | 101333793 B1 | 11/2013 |
| KR | 20160041536 A | 4/2016 |
| WO | WO2012044309 A1 | 4/2012 |
| WO | WO2012044313 A1 | 4/2012 |
| WO | WO2014116244 A1 | 7/2014 |
| WO | WO 2015/116066 A1 | 8/2015 |

OTHER PUBLICATIONS

Ullah, A. et al., "Phase transitions and large electric field-induced strain in BiAlO3-modified Bi0.5(Na,K)0.5TiO3 lead-free piezoelectric ceramics", Current Applied Physics, vol . 10, No. 4, Feb. 12, 2010, pp. 1174-1181.

Hussain, A. et al., "Field-induced strain and polarization response in lead-free Bi1/2(Na0.80K0.20)1/2TiO3-SrZrO3 ceramics", Materials Chemistry and Physics, vol . 143, No. 3, Feb. 1, 2014 (Feb. 1, 2014), pp. 1282-1288.

Jo, Wook, et al. "Giant electric-field-induced strains in lead-free ceramics for actuator applications—status and perspective." Journal of Electroceramics 29.1 (2012): 71-93.

International Search Report and Written Opinion for International Application No. PCT/GB2018/050307 dated May 9, 2018 (10 pages).

Search Report dated Jul. 25, 2017, from the United Kingdom Intellectual Property Office for corresponding United Kingdom Application No. GB1701828.4. (4 pgs.).

Search Report dated Sep. 22, 2017, from the United Kingdom Intellectual Property Office for corresponding United Kingdom Application No. GB1701828.4. (5 pgs.).

Bai, Wangfeng, et al. "Composition-and temperature-driven phase transition characteristics and associated electromechanical properties in Bi 0.5 Na 0.5 TiO 3-based lead-free ceramics." Dalton Transactions 45.20 (2016): 8573-8586.

\* cited by examiner

CERAMIC MATERIAL COMPRISING A PSEUDO-CUBIC PHASE, A PROCESS FOR PREPARING AND USES OF THE SAME

This application is a National Stage Entry of International Application No. PCT/GB2018/050307, filed Feb. 2, 2018, which is based on and claims the benefit of foreign priority under 35 U.S.C. § 119 to GB Application No. 1701828.0, filed Feb. 3, 2017. The entire contents of the above-referenced applications are expressly incorporated herein by reference.

The present invention relates to a bismuth-based solid solution ceramic material, as well as a process for preparing the ceramic material and uses thereof. In particular, the present invention relates to a ceramic material having a general chemical formula (I): $x(Bi_{0.5}Na_{0.5})TiO_3$-$y(Bi_{0.5}K_{0.5})TiO_3$-$z_1SrHfO_3$-$z_2SrZrO_3$, wherein $x+y+z_1+z_2=1$; $y$, $(z_1z_2) \neq 0$; $x \geq 0$; which is particularly useful in an actuator component of a droplet deposition apparatus. In embodiments, the present invention also relates to a ceramic material having a general chemical formula (II): $x(Bi_{0.5}Na_{0.5})TiO_3$-$y(Bi_{0.5}K_{0.5})TiO_3$-$z_1SrHfO_3$-$z_2SrZrO_3$, wherein $x+y+z_1+z_2=1$; $x$, $y$, $(z_1+z_2) \neq 0$; as well as a ceramic material of general formula (III): $y(Bi_{0.5}K_{0.5})TiO_3$-$z_1SrHfO_3$-$z_2SrZrO_3$, wherein $y+z_1+z_2=1$; $y$, $(z_1+z_2) \neq 0$.

Actuator materials are needed to generate electric-field induced strains for a wealth of devices including, for instance, mechanical relays, digital cameras, and ink-jet printers. The composition and crystal structure of the actuator material are critical to determining the actuator characteristics. Common actuator materials include piezoelectric materials which undergo physical changes in shape when exposed to an external electric field. However, dielectric materials that do not exhibit the piezoelectric effect may also potentially find application as actuators.

In principle, all dielectric materials exhibit electrostriction, which is characterised by a change in shape under the application of an electric field. Electrostriction is caused by displacement of ions in the crystal lattice upon exposure to an external electric field; positive ions being displaced in the direction of the field and negative ions displaced in the opposite direction. This displacement accumulates throughout the bulk material and results in an overall macroscopic strain (elongation) in the direction of the field. Thus, upon application of an external electric field, the thickness of a dielectric material will be reduced in the orthogonal directions characterized by Poisson's ratio. Electrostriction is known to be a quadratic effect, in contrast to the related effect of piezoelectricity, which is primarily a linear effect observed only in a certain class of dielectrics.

The critical performance characteristics for an actuator material include the effective piezoelectric coefficient, $d_{33}^*$, the temperature dependence of $d_{33}^*$ and the long-term stability of $d_{33}^*$ in device operation. Lead zirconate titanate (PZT), $Pb(Zr_xTi_{1-x})O_3$, and its related solid solutions, are a well-known class of ceramic perovskite piezoelectric materials that have found use in a wide variety of applications utilising piezoelectric actuation. However, as a result of emerging environmental regulations, there has been a drive to develop new lead-free actuator materials.

Significant attention has been given to electric field induced strain behaviour of alternative lead-free dielectric materials for potential actuator applications, examples of which include $(K,Na)NbO_3$-based materials, $(Ba,Ca)(Zr,Ti)O_3$-based materials and $(Bi,Na,K)TiO_3$-based materials. Ceramics with the perovskite structure have been of particular interest in this regard. The constituent atoms allow the unit cell to deform easily giving rise to various ferroelectrically-active non-cubic perovskite phases such as those with tetragonal, rhombohedral, orthorhombic or monoclinic symmetry. The relatively large spatial tolerance for substitutional atoms is beneficial for chemical modifications, enabling functional properties to be tailored. When an external electric field is applied, these perovskite-structured ceramics are deformed along with the changes in their macroscopic polarisation state.

The perovskite compound bismuth sodium titanate $(Bi_{0.5}Na_{0.5})TiO_3$ ("BNT") has, in particular, been studied extensively in the pursuit of lead-free actuator materials, including solid solutions comprising BNT with other components intended to enhance BNT's dielectric and piezoelectric properties. WO 2012/044313 and WO 2012/044309 describe a series of lead-free piezoelectric materials based on ternary compositions of BNT and $(Bi_{0.5}K_{0.5})TiO_3$ ("BKT") in combination with $(Bi_{0.5}Zn_{0.5})TiO_3$ ("BZT"), $(Bi_{0.5}Ni_{0.5})TiO_3$ ("BNiT"), or $(Bi_{0.5}Mg_{0.5})TiO_3$ ("BMgT"). WO 2014/116244 also describes ternary compositions of $BiCoO_3$ together with perovskites such as $BaTiO_3$ ("BT"), $(Na,K)NbO_3$ ("KNN"), BNT and BKT.

Perovskite ceramic materials which exhibit giant electrostrains have become a growing focus for potential actuator applications. A giant electric-field induced strain was, for example, found in the case of the BNT-BT-KNN perovskite ceramic system which was considered a particularly interesting discovery in the pursuit of lead-free ceramics which may compete with PZT in actuator applications. There has been speculation that desirable giant electrostrains, such as that exhibited by BNT-BT-KNN, may be attributed to a reversible phase transformation from a disordered ergodic (non-polar) relaxor state to a long-range non-ergodic (polar) ferroelectric ordered state in certain perovskite ceramics driven by an external electric field, as discussed in J Electroceram (2012) 29: 71-93. The characteristics of the giant strain in the BNT-BT-KNN perovskite ceramic system are, for instance, illustrated by composition dependent strain hysteresis loops in FIG. 9 of J Electroceram (2012) 29: 71-93.

In J Electroceram (2012) 29: 71-93 it is indicated that the giant electrostrains exhibited via the piezoelectric effect are the result of a strain-generating phase transition and that such a phenomenon extends the opportunities for actuator applications in a new manner. Furthermore, it is also said that BNT-based systems exhibiting giant electric-field-induced strains have the potential to replace PZT in the realm of actuator applications provided that certain challenges can be overcome, such as relatively large driving electric fields and frequency dependence, as well as temperature instability.

Bai et al., Dalton Trans., 2016, 45, 8573-8586, describe a lead-free BNT-BT-BZT ceramic system and how the addition of BZT to a solid solution of BNT-BT has a strong impact on the phase transition characteristics and electromechanical properties, as confirmed by X-ray diffraction (XRD) measurements, Raman spectra analysis and temperature-dependent changes in polarisation and strain hysteresis loops. Bai et al. describe that the addition of BZT "disrupts" the ferroelectric order to create a "non-polar" phase at zero electric field. On the application of an electric field, the BNT-BT-BZT ceramic material transitions from a pseudo-cubic mixture of tetragonal and rhombohedral structures to a purely rhombohedral phase.

There remains a need for alternative lead-free perovskite ceramic materials which exhibit giant electrostrains associated with a phase transition mechanism for use in actuator applications and without the deficiencies associated with large electric field and frequency dependence and/or temperature instability. The present invention is based on the discovery of a new bismuth-based ceramic material which exhibits giant electrostrain whilst also exhibiting other properties which make it particularly suitable for use in actuator applications.

SUMMARY

Thus, in a first aspect, the present invention relates to a solid solution ceramic material having a general chemical formula (I):

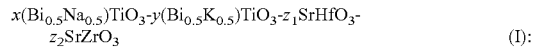

wherein: $x+y+z_1+z_2=1$; y, $(z_1+z_2)\neq 0$; $x\geq 0$ and
wherein the ceramic material comprises a pseudo-cubic phase having an axial ratio c/a of from 0.995 to 1.005 and/or a rhombohedral angle of 90±0.5 degrees. The ceramic material of formula (I) is capable of a reversible field induced phase transition from the pseudo-cubic phase to a tetragonal phase having an axial ratio c/a of between 1.005 and 1.02 (i.e. greater than 1.005 and less than 1.02).

One embodiment of the present invention relates to a solid solution ceramic material having a general chemical formula (II):

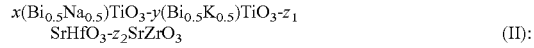

wherein: $x+y+z_1+z_2=1$; x, y, $(z_1+z_2)\neq 0$; and
wherein the ceramic material comprises a pseudo-cubic phase having an axial ratio c/a of from 0.995 to 1.005 and/or a rhombohedral angle of 90±0.5 degrees. The ceramic material of formula (II) is capable of a reversible field induced phase transition from the pseudo-cubic phase to a tetragonal phase having an axial ratio c/a of between 1.005 and 1.02 (i.e. greater than 1.005 and less than 1.02).

Another embodiment of the present invention relates to a solid solution ceramic material having a general chemical formula (III):

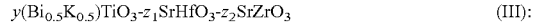

wherein: $y+z_1+z_2=1$; y, $(z_1+z_2)\neq 0$;
wherein the ceramic material comprises a pseudo-cubic phase having an axial ratio c/a of from 0.995 to 1.005 and/or a rhombohedral angle of 90±0.5 degrees. The ceramic material of formula (III) is capable of a reversible field induced phase transition from the pseudo-cubic phase to a tetragonal phase having an axial ratio c/a of between 1.005 and 1.02 (i.e. greater than 1.005 and less than 1.02).

The invention also provides methods for preparing the ceramic materials of formula (I) and the subsets of ceramic materials according to formula (II) and formula (III), a method of reversibly converting a ceramic material of formula (I), (II) or (III) into a ceramic material comprising a major proportion of a tetragonal phase, as well as an actuator component and droplet deposition apparatus comprising the ceramic materials of formula (I), (II) or (III).

DETAILED DESCRIPTION

Figure 1:
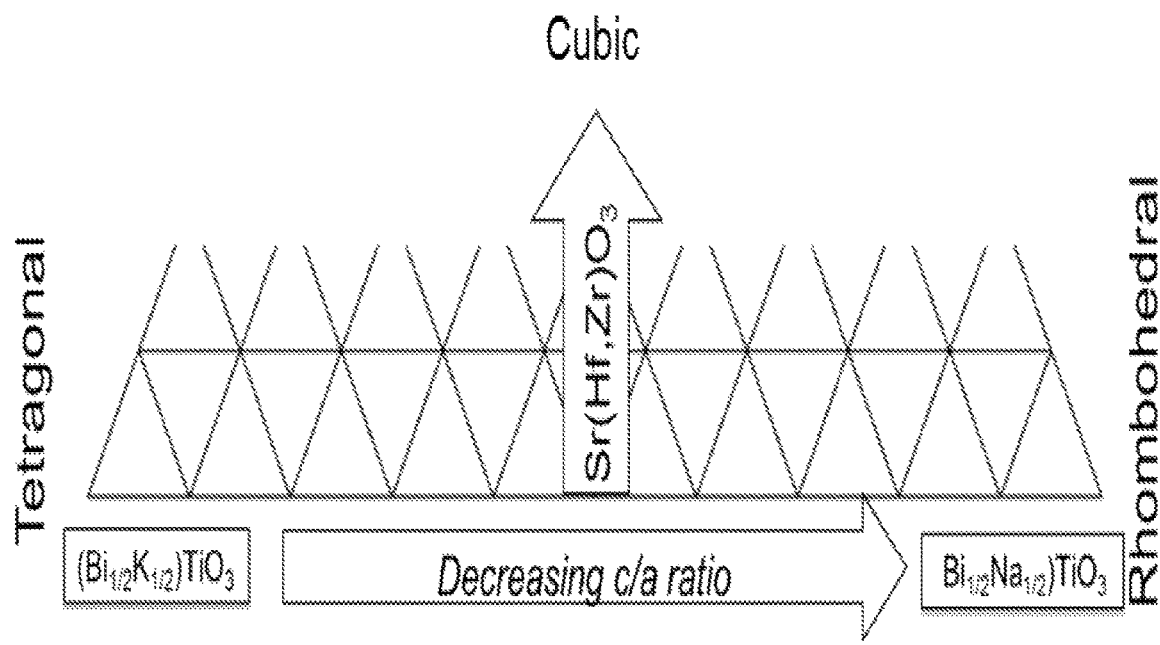
FIG. 1: shows a phase diagram for a solid solution of BNT-BKT-Sr(Hf,Zr)O$_3$ and the effect on symmetry in varying the molar fraction of the perovskite compound constituents.
Figure 2:
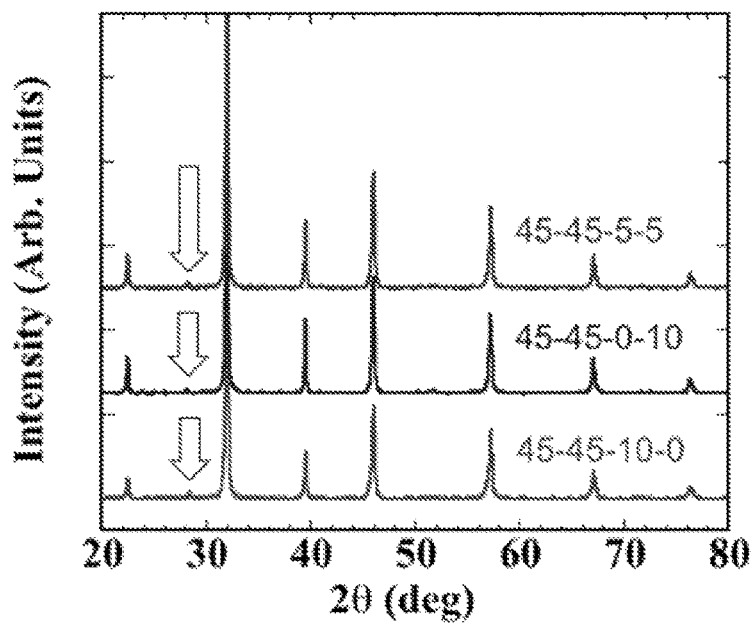
FIG. 2: shows XRD diffractograms for BNT-BKT-SrHfO$_3$—SrZrO$_3$ ceramics having mole fractions of: i) 45-45-10-0; ii) 45-45-0-10; and iii) 45-45-5-5.
Figure 3A:
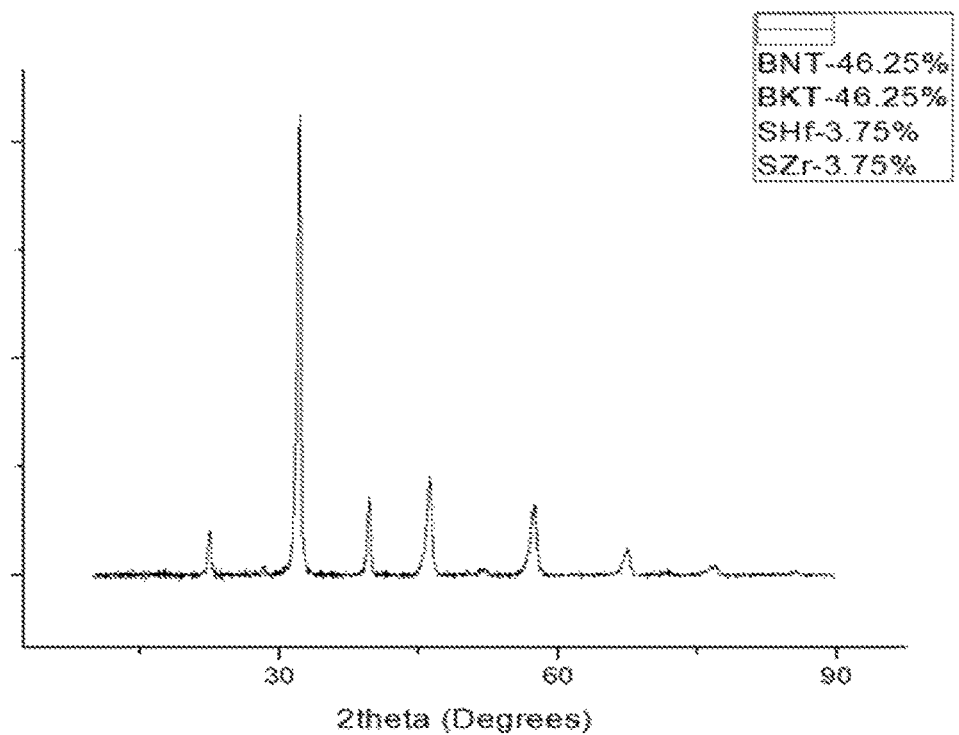
FIGS. 3a-b: show XRD diffractograms for BNT-BKT-SrHfO$_3$—SrZrO$_3$ ceramics having mole fractions of: a) 46.5-46.5-3.75-3.75; and b) 46.5-46.5-0-7.5.
Figure 3B:
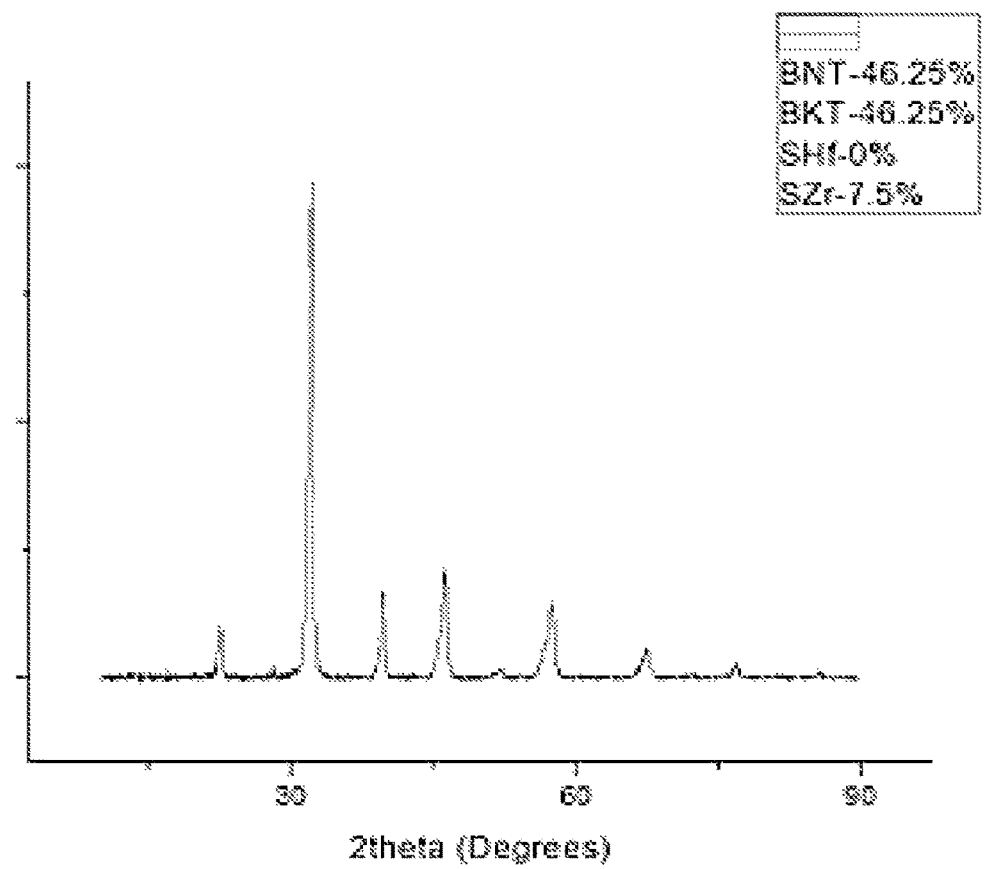
Figure 4:
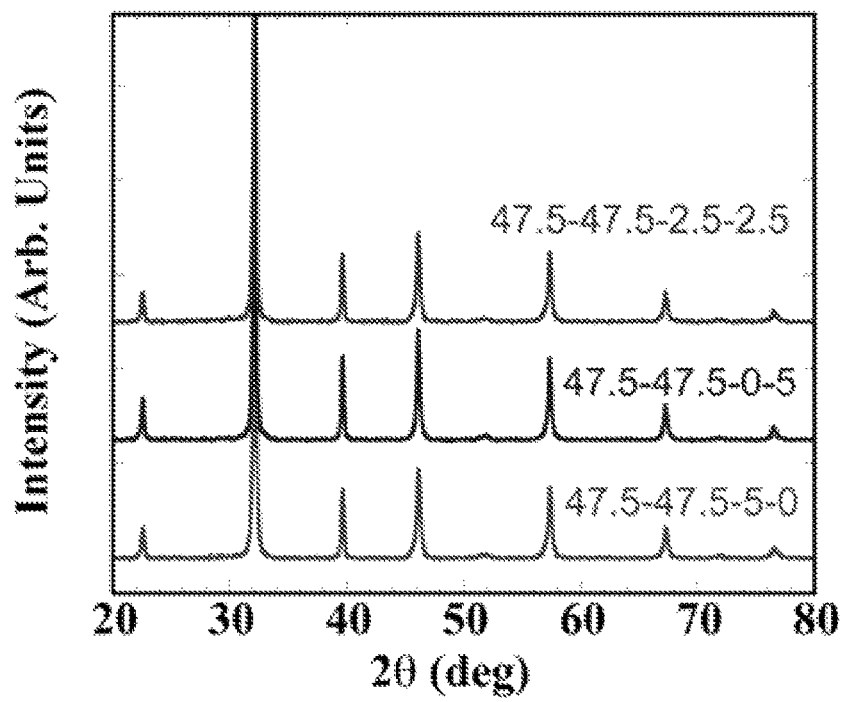
FIG. 4: shows XRD diffractograms for BNT-BKT-SrHfO$_3$—SrZrO$_3$ ceramics having mole fractions of: i) 47.5-47.5-2.5-2.5; ii) 47.5-47.5-0-5; and iii) 47.5-47.5-5-0.
Figure 5A:
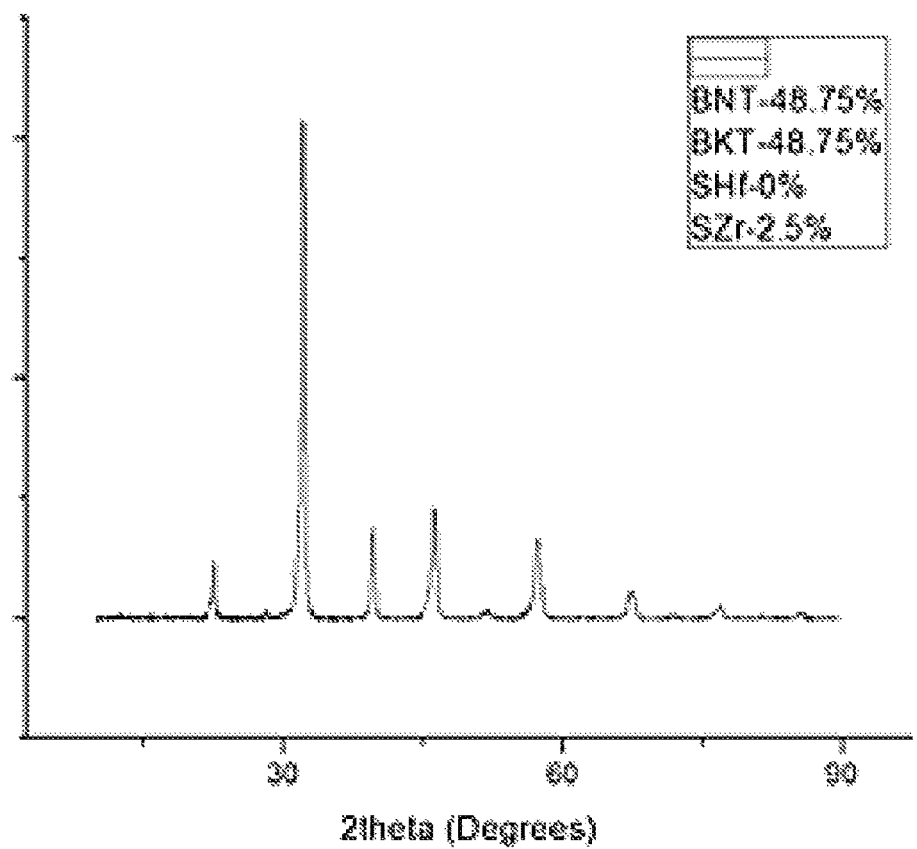
FIGS. 5a-b: show XRD diffractograms for BNT-BKT-SrHfO$_3$—SrZrO$_3$ ceramics having mole fractions of: a) 48.75-48.75-0-2.5; and b) 48.75-48.75-1.25-1.25.
Figure 5B:
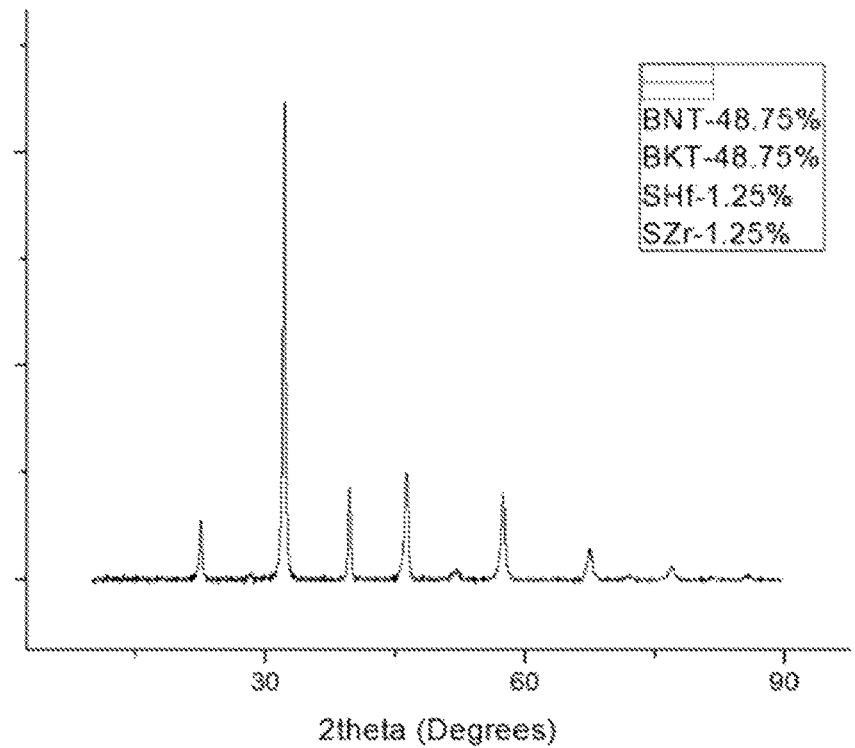

It has been surprisingly found by the inventors that a particularly advantageous ceramic material exhibiting giant electrostrain may be prepared based on a selection of certain perovskite compounds having particular phase characteristics which, when combined to form a solid solution, are capable of electric field induced strains as a result of a phase transition, in particular from a pseudo-cubic phase to a tetragonal phase. This corresponds to a form of "cross-over" or "relaxor-to-ferroelectric transition" mechanism through which an electric field may be used to induce strain.

Generally, in order to prepare a ceramic material which exhibits the particular desirable phase transition, it has been found by the inventors to be advantageous to modify a solid solution ceramic material exhibiting a tetragonal phase ("parent phase") by incorporating one or more additional perovskite compounds ("disorder phase") into the solid solution. The addition of the disorder phase acts to disrupt the long range tetragonal order of the parent phase (i.e. the long range electric dipolar order underpinning the tetragonal phase) such that the resulting ceramic material exhibits a pseudo-cubic phase in the absence of an applied electric field. When an electric field is applied to the ceramic material having the pseudo-cubic phase, a giant electrostrain may be observed which is associated with a transition from the pseudo-cubic phase to the tetragonal phase, associated with the parent phase.

It has been found by the inventors to be particularly advantageous to provide a parent phase which has a tetragonal phase having an axial ratio c/a of between 1.005 and 1.02. The axial ratio c/a is defined based on the lattice parameters of the perovskite unit cell, specifically as the length of crystallographic (001) axis (c) divided by the (100) axis (a). The desired axial ratio c/a may be achieved by combining perovskite compounds forming the parent phase in certain molar ratios. In that regard, phase and crystal structure, including the axial ratio c/a of a ceramic material, may be readily identified using X-ray diffraction (XRD) analysis, for instance, employing Cu Kα radiation.

The axial ratio c/a of the parent phase has an impact on the magnitude of the strain generated though the electric field induced phase transition in accordance with the present invention. A parent tetragonal phase having an axial ratio c/a of between 1.005 and 1.02 has been found to be particularly useful based on overall polarisation and strain level. Where too large an axial ratio c/a is associated with the parent phase, the electric field induced transition may be difficult to obtain (e.g. require a high coercive field). In contrast, where too small an axial ratio c/a is associated with the parent phase, the overall induced strain from the phase transition may be too small. A parent phase having an axial ratio c/a of between 1.005 and 1.02 has been found by the inventors to give rise to a large electric field induced strain at practical field levels, for example at approximately 10 to 30 kV/cm.

In accordance with an aspect of the present invention, the parent phase having the desired axial ratio c/a may be readily prepared as a solid solution of a tetragonal perovskite compound and non-tetragonal perovskite compound, such as a low-tolerance factor perovskite compound (e.g. a cubic, orthorhombic, monoclinic or rhombohedral perovskite compound). As is well known, the perovskite tolerance factor is essentially a geometric parameter which describes the relative packing density of the A- and B-sites in the perovskite structure, "$ABX_3$.". Thus, the non-tetragonal perovskite compound may be included in a solid solution with the tetragonal perovskite compound in an appropriate molar ratio which affords the desired axial ratio c/a for the parent phase.

In accordance with an aspect of the present invention, the parent phase corresponds specifically to a solid solution of BNT and BKT. BKT is a tetragonal ferroelectric perovskite compound having an axial ratio c/a of 1.019 whilst BNT is a non-tetragonal perovskite compound, and is known as a rhombohedral or pseudo-cubic perovskite compound with an axial ratio c/a close to 1.0. When these perovskite compounds are combined in the form of solid solution, axial ratio c/a is a function of the mole fraction of each component and so it is possible to prepare a parent phase having the desired axial ratio c/a of between 1.005 and 1.02. This may be verified by XRD analysis of binary compositions of BNT and BKT (i.e. representative of the parent phase) which have BNT and BKT present at a particular molar ratio. This same molar ratio of BNT to BKT can then be used for the preparation of a solid solution ceramic material in accordance with the invention which further comprises the disorder phase (i.e. perovskite compounds $SrHfO_3$, $SrZrO_3$ or mixtures thereof). This means that the resulting solid solution ceramic material is capable of an electric field induced reversible phase transition from the pseudo-cubic phase to the tetragonal phase associated with the parent phase.

Alternatively, the parent phase having the desired axial ratio c/a may be provided by a single tetragonal perovskite compound. In accordance with this aspect of the present invention, the parent phase corresponds specifically to BKT. As mentioned above, BKT is a tetragonal ferroelectric perovskite compound having an axial ratio c/a of 1.019.

In order to benefit from electric field induced strain, the present invention relies on a phase transition as part of a "cross-over" or "relaxor-to-ferroelectric transition" mechanism. In accordance with the present invention, a ceramic material exhibiting such properties may be prepared by the introduction of a disorder phase into the parent phase to form a solid solution with a modified crystal structure. This is illustrated in FIG. 1, which shows a phase diagram for the solid solution of BNT-BKT-Sr(Hf,Zr)$O_3$, and illustrates the effects of varying the mole fractions of the perovskite components associated with parent and disorder phases. In particular, the disorder phase is added to the parent phase at a molar ratio sufficient to disrupt the long range tetragonal order of the parent phase such that the resulting solid solution ceramic material exhibits a pseudo-cubic phase, where a pseudo-cubic phase is defined herein as having an axial ratio c/a of from 0.995 to 1.005 and/or a rhombohedral angle of 90±0.5 degrees.

Specifically, the disorder phase which is used in accordance with the present application derives from perovskites $SrHfO_3$, $SrZrO_3$ or mixtures thereof. The introduction of $Sr^{2+}$ into the solid solution populates the A-site of the perovskite structure which is particularly effective in disrupting the long range dipolar order of the tetragonal phase because its size and electronic structure differ significantly from $Bi^{3+}$ and $Na^+/K^+$ cations derived from the BNT-BKT or BKT parent phase. Similarly, the addition of $Zr^{4+}$ and/or $Hf^{4+}$ on the B-site of the perovskite structure introduces disorder due to the increase in ionic size compared to $Ti^{4+}$ derived from the parent phase (ionic radius of 0.605 Å for $Ti^{4+}$, as compared to 0.72 Å for $Zr^{4+}$ and 0.71 Å for $Hf^{4+}$). The cumulative effect of the addition of $SrHfO_3$, $SrZrO_3$ or mixtures thereof results in changing the overall symmetry of the solid solution from tetragonal/polar to pseudo-cubic/non-polar.

The present invention thus relates to a solid solution ceramic material for use in actuator applications, preferably for use as an actuator component in a droplet deposition apparatus, having a general chemical formula (I):

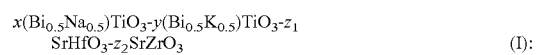

$$x(Bi_{0.5}Na_{0.5})TiO_3\text{-}y(Bi_{0.5}K_{0.5})TiO_3\text{-}z_1 SrHfO_3\text{-}z_2SrZrO_3 \quad \text{(I):}$$

wherein: $x+y+z_1+z_2=1$; y, $(z_1+z_2)\neq 0$; $x\geq 0$ and
wherein the ceramic material comprises a pseudo-cubic phase having an axial ratio c/a of from 0.995 to 1.005 and/or a rhombohedral angle of 90±0.5 degrees. The ceramic material of formula (I) is capable of a reversible field induced phase transition from the pseudo-cubic phase to a tetragonal phase having an axial ratio c/a of between 1.005 and 1.02 (i.e. greater than 1.005 and less than 1.02).

The present invention also relates to subsets of compounds of formula (I) above according to formula (II) and formula (III).

Thus, in one embodiment the present invention also relates to a ceramic material having a general chemical formula (II):

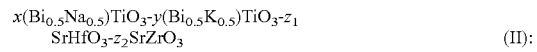

$$x(Bi_{0.5}Na_{0.5})TiO_3\text{-}y(Bi_{0.5}K_{0.5})TiO_3\text{-}z_1 SrHfO_3\text{-}z_2SrZrO_3 \quad \text{(II):}$$

wherein: $x+y+z_1+z_2=1$; x, y, $(z_1+z_2)\neq 0$; and
wherein the ceramic material comprises a pseudo-cubic phase having an axial ratio c/a of from 0.995 to 1.005 and/or a rhombohedral angle of 90±0.5 degrees. The terms x, y, $z_1$ and $z_2$ above describe the molar relationships (i.e. mole fractions) of BNT, BKT, $SrHfO_3$ and $SrZrO_3$ in the ceramic material.

In another embodiment, the present invention also relates to a ceramic material having a general chemical formula (III):

$$y(Bi_{0.5}K_{0.5})TiO_3\text{-}z_1SrHfO_3\text{-}z_2SrZrO_3 \quad (III)$$

wherein: $y+z_1+z_2=1$; $y$, $(z_1+z_2)\neq 0$; and
wherein the ceramic material comprises a pseudo-cubic phase having an axial ratio c/a of from 0.995 to 1.005 and/or a rhombohedral angle of 90±0.5 degrees. The terms y, $z_1$ and $z_2$ above describe the molar relationships (i.e. mole fractions) of BKT, $SrHfO_3$ and $SrZrO_3$ in the ceramic material.

As will be appreciated by the skilled person, the ceramic material of formula (I), (II) or (III) of the present invention exhibits a pseudo-cubic phase having an axial ratio c/a of from 0.995 to 1.005 and/or a rhombohedral angle of 90±0.5 degrees at zero electric field and under standard conditions of temperature and pressure (i.e. 25° C. and 1.01 bar (101 kPa)). The ceramic material of formula (I), (II) or (II) is also capable of a field induced reversible phase transition from the pseudo-cubic phase to a tetragonal phase having an axial ratio c/a of between 1.005 and 1.02 under standard conditions of temperature and pressure (i.e. 25° C. and 1.01 bar (101 kPa)).

Computer modeling may be used to aid in evaluating the crystallographic properties of a solid solution of a combination of BKT/BNT with $SrHfO_3$ and/or $SrZrO_3$ over different molar ratios of the compounds, if desired. The skilled person is familiar with a number of open-source software packages that may be of use in this regard. For example, use may be made of molecular dynamics simulator software, such as the large-scale atomic/molecular massively parallel simulator (LAMMPS) from Sandia National Laboratories, in order to predict stability of solid solutions of different crystalline components. Alternatively or additionally, use may also be made of density functional theory (DFT) software, such as OpenMX.

The term "solid solution" used herein refers to a mixture of two or more crystalline solids that combine to form a new crystalline solid, or crystal lattice, that is composed of a combination of the elements of the constituent compounds. As will be appreciated, the solid solution ceramic materials according to formula (I), (II) or (III) referred to herein may consist essentially of its constituent crystalline compounds as well as dopants and inevitable impurities. The solid solution exists over a partial or complete range of proportions or mole ratios of the constituent compounds, where at least one of the constituent compounds may be considered to be the "solvent" phase.

The term "dopant" used herein refers to a metallic component which may be dissolved in the solid solution of the ceramic materials of the invention in order to modify performance or engineering characteristics of the ceramic material, without having any material impact on the overall phase and symmetry characteristics of the solid solution. For instance, dopants may be used to modify grain size and domain mobility, or to improve resistivity (e.g. by compensating for excess charge carriers), temperature dependence and fatigue properties.

Examples of suitable dopants include materials comprising a metallic cation, preferably selected from Mn, Mg, Nb and Ca, for example $MnO_2$, MgO, $Nb_2O_5$ and CaO. Preferably the solid solution ceramic materials of the invention contain less than 5 wt. %, preferably less than 2 wt. %, more preferably less than 0.5 wt. % of dopant. In other preferred embodiments, the solid solution ceramic materials of the invention contain no dopant.

The solid solution ceramic materials of formula (I), (II) and (III) comprise a single dominant crystallographic phase, i.e. the ceramic material has a major portion of its microstructure (i.e. above 50 vol. %) which corresponds to a specific crystallographic phase (i.e. the pseudo-cubic phase). Thus, in other words, where a solid solution ceramic material of formula (I), (II) and (III) comprises multiple crystalline components in its microstructure, a single crystalline phase is present as the major proportion of the ceramic material's microstructure. Additional crystalline phases that may be present collectively represent a minor proportion of the ceramic material's microstructure. The lattice dimensions of the dominant crystalline phase, and the physical and chemical properties of the solid solution, are continuous functions of composition. The lattice symmetry may change within said composition range by uniform distortion of the structure as the composition changes. In preferred embodiments the ceramic material of formula (I), (II) or (III) comprises at least 70 vol. %, more preferably at least 80 vol. %, even more preferably at least 90 vol. %, yet more preferably at least 95 vol. % of the pseudo-cubic phase. Most preferably, the solid solution ceramic material of formula (I), (II) or (III) is substantially homogeneous, having only a single crystalline phase.

In the presence of an applied electric field, the major crystalline phase of the ceramic material of formula (I), (II) or (III) reversibly transitions from the pseudo-cubic phase to a tetragonal phase having an axial ratio c/a of between 1.005 and 1.02. Thus, analogously, the major crystalline phase of the ceramic material becomes the tetragonal phase following the field induced phase transition (i.e. greater than 50 vol. % of the ceramic material microstructure is tetragonal following the field induced phase transition).

The solid solution ceramic materials of formula (I), (II) or (III) may exhibit a phase stability over a large range of temperature (i.e. no temperature induced phase transition occurring over a large range of temperature). The ceramic materials may also undergo the field induced phase transition discussed herein over a large range of temperature. In preferred embodiments, the solid solution ceramic materials according to formula (I), (II) or formula (III) of the present invention exhibit phase stability and are active for a field induced phase transition in accordance with the invention over a temperature range of from −50° C. to 200° C., more preferably from −5° C. to 150° C., still more preferably from 0° C. to 100° C.

In some embodiments of the invention, the disorder phase that is employed in preparing the ceramic material of the invention corresponds to a mixture of $SrHfO_3$ and $SrZrO_3$ such that $z_1$ and $z_2 \neq 0$ in formula (I), (II) or (III) above. In other embodiments, $SrHfO_3$ or $SrZrO_3$ are present in the ceramic material singly.

Thus, in some embodiments, $z_1=0$ and the ceramic material has the general formula (II)(a):

$$x(Bi_{0.5}Na_{0.5})TiO_3\text{-}y(Bi_{0.5}K_{0.5})TiO_3\text{-}z_2SrZrO_3. \quad (II)(a):$$

In other embodiments, $z_2=0$ and the ceramic material has the general formula (II)(b):

$$x(Bi_{0.5}Na_{0.5})TiO_3\text{-}y(Bi_{0.5}K_{0.5})TiO_3\text{-}z_1SrHfO_3. \quad (II)(b):$$

In other embodiments, $z_1=0$ and the ceramic material has the general formula (III)(a):

$$y(Bi_{0.5}K_{0.5})TiO_3\text{-}z_2SrZrO_3. \quad (III)(a):$$

In other embodiments, $z_2=0$ and the ceramic material has the general formula (III)(b):

$$y(Bi_{0.5}K_{0.5})TiO_3\text{-}z_1SrHfO_3. \quad (III)(b):$$

As discussed above, the advantages of the present invention derive from a field induced transition specifically from the pseudo-cubic phase to the tetragonal phase. Conceptually, this can be considered to correspond to a transition between the dominant crystalline structure associated with parent pseudo-cubic phase and tetragonal phase. Where BNT and BKT are employed in the parent phase, the molar ratio of BNT to BKT that is employed in the ceramic material of formula (I) or formula (II) corresponds to that which is suitable for there to be a facile field-induced phase transition from the pseudo-cubic phase to a tetragonal phase having an axial ratio c/a of between 1.005 and 1.02. Preferably, the ceramic material of formula (I), (II) or (III) undergoes a field induced phase transition to a tetragonal phase having an axial ratio c/a of between 1.01 and 1.02.

The characteristic field induced transition associated with the ceramic material of the present invention may be provided by utilising a molar ratio of BNT to BKT in the ceramic material of formula (I) or formula (II) which would provide a tetragonal phase having an axial ratio c/a of between 1.005 and 1.02, preferably an axial ratio c/a of between 1.01 and 1.02, in a binary mixture of these two perovskite compounds in a solid solution (i.e. in a binary parent phase of these compounds).

A mole fraction of BNT in the ceramic material of formula (II) corresponding to: $0.25 \leq x \leq 0.65$, preferably $0.35 \leq x \leq 0.55$, more preferably $0.40 \leq x \leq 0.50$, has been found to be particularly suitable in accordance with the present invention.

A mole fraction of BKT in the ceramic material of formula (II) corresponding to: $0.25 \leq y \leq 0.75$, preferably $0.35 \leq y \leq 0.55$, more preferably $0.40 \leq y \leq 0.50$, has been found to be particularly suitable in accordance with the present invention.

A mole fraction of $SrHfO_3$ and/or $SrZrO_3$ in the ceramic material of formula (II) corresponding to: $0.01 \leq (z_1+z_2) \leq 0.15$, preferably $0.02 \leq (z_1+z_2) \leq 0.10$, more preferably $0.04 \leq (z_1+z_2) \leq 0.08$, has been found to be particularly suitable in accordance with the present invention.

In particularly preferred embodiments, mole fractions of BNT, BKT, $SrHfO_3$ and/or $SrZrO_3$ in the ceramic material of formula (II) correspond to $0.40 \leq x \leq 0.50$; $0.40 \leq y \leq 0.50$; and $0.02 \leq (z_1+z_2) \leq 0.10$.

A mole fraction of BKT in the ceramic material of formula (III) corresponding to: $0.75 \leq y \leq 0.99$, preferably $0.80 \leq y \leq 0.98$, more preferably $0.90 \leq y \leq 0.95$, has been found to be particularly suitable in accordance with the present invention.

A mole fraction of $SrHfO_3$ and/or $SrZrO_3$ in the ceramic material of formula (III) corresponding to: $0.01 \leq (z_1+z_2) \leq 0.25$, preferably $0.02 \leq (z_1+z_2) \leq 0.20$, more preferably $0.04 \leq (z_1+z_2) \leq 0.10$, has been found to be particularly suitable in accordance with the present invention.

The ceramic material of formula (I), (II) or (UI) of the present invention preferably has a remanent polarisation of less than $<5$ $\mu C/cm^2$, as determined from polarisation hysteresis measurements at, for example, 1 Hz.

The ceramic material of formula (I), (II) or (III) of the present invention preferably has an effective piezoelectric strain coefficient $d_{33}*$ of from 50 to 500 pm/V. Reference to the effective piezoelectric coefficient ($d_{33}*$) herein refers to that which is determined from dividing the maximum electromechanical strain ($S_{max}$) by the maximum applied electric field ($E_{max}$) ($d_{33}*=S_{max}/E_{max}$).

The ceramic material of formula (I), (II) or (III) of the present invention preferably has a maximum electromechanical strain value of from 0.1% to 0.5%, when measured at 10 Hz and at standard and temperature and pressure (i.e. 25° C. and 1.01 bar (101 kPa)).

The ceramic material of formula (I), (II) or (III) of the present invention preferably has a field induced polarisation of from 10 to 50 $\mu C/cm^2$, as determined from polarisation hysteresis measurements at, for example, 1 Hz.

Effective piezoelectric coefficient ($d_{33}*$), electromechanical strain response and polarisation hysteresis may be measured using any suitable measurement device familiar to the skilled person, including, for example, an AixACCT Piezoelectric Characterization System fitted with an interferometer.

The ceramic material of formula (I), (II) or (III) of the present invention may be prepared by any suitable solid-state synthesis method of which the skilled person is familiar using the appropriate amounts of precursors selected from $Bi_2O_3$, $TiO_2$, $Na_2CO_3$, $K_2CO_3$, $SrCO_3$, $ZrO_2$, and $HfO_2$ starting powders of at least 99% purity. In general, conventional solid state synthesis methods for making ceramic materials involve milling of the powder precursors, followed by shaping and calcining to produce the desired ceramic product. Milling can be either wet or dry type milling. High energy vibratory milling may be used, for instance, to mix starting powders, as well as for post-calcination grinding. Where wet milling is employed, the powders are mixed with a suitable liquid (e.g., ethanol or water, or combinations thereof) and wet milled with a suitable high density milling media (e.g., yttria stabilized zirconia (YSZ) beads). The milled powders are calcined, then mixed with a binder, formed into the desired shape (e.g., pellets) and sintered to produce a ceramic product with high sintered density.

For testing purposes, prior to electrical measurements, the ceramic disc may be polished to a suitable thickness (e.g., 0.9 mm), and a silver paste (e.g., Heraeus C1000) is applied to both sides of the discs. Depending upon the intended end use, a high-density ceramic disc or pellet may be polished to a thickness in the range of about 0.5 pm to about 1 pm.

The solid solution ceramic material of formula (I), (II) or (III) may also be fabricated in the form of a thin film by any suitable deposition method. For example, atomic layer deposition (ALD), chemical vapour deposition (CVD) (including plasma-enhanced chemical vapour deposition (PECVD) and metalorganic chemical vapour deposition (MOCVD)), and chemical solution deposition (CSD) may be employed. using appropriate precursors. Examples of suitable precursors include titanium (IV) isopropoxide, titanium butoxide, bismuth acetate, bismuth nitrate, bismuth 2-ethylhexanoate, barium acetate, barium nitrate, barium 2-ethylhexanoate, sodium acetate trihydrate, sodium nitrate, potassium acetate, potassium nitrate, magnesium acetate tetrahydrate, magnesium nitrate, zinc acetate and zinc nitrate. Suitable solvents that may be employed in these methods where appropriate include alcohols (for example, methanol, ethanol and 1-butanol) and organic acids (for example, acetic acid and propionic acid). Suitable stabilisers that may be employed in these methods where appropriate include acetylacetone and diethanolamine. Sputtering using solid state sintered or hot-pressed ceramic targets may also be employed, if desired. Such thin films may have a thickness in the range of from 0.3 µm to 5 µm, preferably in the range of from 0.5 µm to 3 µm.

Where the solid solution ceramic material is fabricated as a thin film, it will be appreciated that tensile stresses associated with the thin film can affect field-induced strains and the magnitude of the effective piezoelectric coefficient $d_{33}*$. The skilled person is able to determine the extent of residual tensile stresses associated with a fabricated thin film and take steps to control such stresses (for example, utilising thermal anneals to relieve stress, by designing the device architecture to achieve a desired stress state, and by adjusting film thickness) in order to gain the maximum benefit of the field-induced strains associated with the solid solution ceramic materials of the present invention.

As will be appreciated, this approach can also, for instance, be utilised when the solid solution ceramic material is fabricated as a thin film forming part of an actuator component of a droplet deposition apparatus, described in further detail below. The skilled person is able to accommodate for, or mitigate, intrinsic stresses resulting from the configuration of the actuator component so as to ensure that the reversible phase transition associated with the ceramic material of the invention is possible in response to an electric field. Thus, as applied to the droplet deposition apparatus, the skilled person is able to ensure that the gain or loss of electric-field induced strain resulting from the reversible phase change caused by the application of an ejection waveform to an actuator element formed of the ceramic material is sufficient to cause ejection of a droplet. In one example, this might be accomplished by appropriate design of the ejection waveform. This may, for instance, include identifying a suitable amplitude for the ejection waveform (e.g. suitable peak-to-peak amplitude) and/or identifying suitable maximum and minimum voltage values (with the characteristic phase transition occurring upon change between maximum and minimum voltage values). The thus-designed ejection waveform may accommodate for, or mitigate, the effect that intrinsic stresses have on the conditions necessary to elicit the reversible phase transition.

In accordance with a further aspect, the present invention also provides a method of reversibly converting a ceramic material of formula (I), (II) or (III) as described hereinabove into a ceramic material comprising a major proportion of a tetragonal phase, said method comprising the step of applying an electric field to the ceramic material of formula (I), (II) or (III). Preferably, the tetragonal phase has an axial ratio c/a of between 1.005 and 1.02.

In accordance with a still further aspect, the present invention also provides a method of preparing a solid solution ceramic material having the general chemical formula (II):

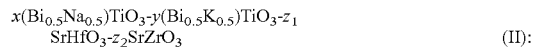

(II):

wherein: $x+y+z_1+z_2=1$; x, y, $(z_1+z_2) \neq 0$;
wherein the ceramic material comprises a pseudo-cubic phase having an axial ratio c/a of from 0.995 to 1.005 and/or a rhombohedral angle of 90±0.5 degrees;
said method comprising the steps of:
i) mixing precursors for the components of the ceramic material in predetermined molar ratios;
ii) utilising the mixture of precursors formed in step i) in solid-state synthesis to prepare a ceramic material according to formula (II);
wherein the predetermined molar ratios of precursors are determined based on: a) the molar ratio of $(Bi_{0.5}Na_{0.5})TiO_3$ precursors to $(Bi_{0.5}K_{0.5})TiO_3$ precursors required to form a tetragonal phase in a binary $(Bi_{0.5}Na_{0.5})TiO_3$—$(Bi_{0.5}K_{0.5})TiO_3$ based ceramic material; and b) the molar ratio of $SrHfO_3$ precursors and/or $SrZrO_3$ precursors to $(Bi_{0.5}Na_{0.5})TiO_3$ and $(Bi_{0.5}K_{0.5})TiO_3$ precursors required to form a ceramic material having the general chemical formula (II) which comprises a pseudo-cubic phase. The ceramic material formed in step ii) of the method may be as described in any embodiments discussed hereinbefore. Preferably, the binary $(Bi_{0.5}Na_{0.5})TiO_3$—$(Bi_{0.5}K_{0.5})TiO_3$ composition corresponding to the parent phase comprises a tetragonal phase having an axial ratio c/a of between 1.005 and 1.02.

In accordance with yet another aspect, there is provided a method of preparing a solid solution ceramic material having the general chemical formula (III):

(III)

wherein: $y+z_1+z_2=1$; y, $(z_1+z_2) \neq 0$;
wherein the ceramic material comprises a pseudo-cubic phase having an axial ratio c/a of from 0.995 to 1.005 and/or a rhombohedral angle of 90±0.5 degrees;
said method comprising the steps of:
i) mixing precursors for the components of the ceramic material in a predetermined molar ratio;
ii) utilising the mixture of precursors formed in step i) in solid-state synthesis to prepare a ceramic material according to formula (III);
wherein the predetermined molar ratio of precursors are determined based on the molar ratio of $(Bi_{0.5}K_{0.5})TiO_3$ precursors to $SrHfO_3$ precursors and/or $SrZrO_3$ precursors required to form a ceramic material having the general chemical formula (III) which comprises a pseudo-cubic phase. The ceramic material formed in step ii) of the method may be as described in any embodiments discussed hereinbefore.

Ceramic materials of formula (I), (II) and (III) which exhibit the electric field induced strain derived from a reversible phase transition may be employed as actuating elements in a variety of actuator components. For instance, such an actuator component may find use in a droplet deposition apparatus. Droplet deposition apparatuses have widespread usage in both traditional printing applications, such as inkjet printing, as well as in 3D printing and other materials deposition or rapid prototyping techniques.

Thus, in accordance with another aspect, the present invention also provides an actuator component for use in a droplet deposition apparatus comprising a ceramic material of formula (I), (II) or (III) as described hereinabove. Accordingly, in a related aspect, there is also provided a method of actuating the actuator component, said method comprising the step of applying an electric field to the actuator component. In another related aspect, there is provided a droplet deposition apparatus comprising the actuator component.

An actuator component suitable for use in a droplet deposition apparatus may, for instance, comprise a plurality of fluid chambers, which may be arranged in one or more rows, each chamber being provided with a respective actuator element and a nozzle. The actuating element is actuatable to cause the ejection of fluid from a chamber of the plurality through a corresponding one of the nozzles. The actuating element is typically provided with at least first and second actuation electrodes configured to apply an electric field to the actuating element, which is thereby deformed, thus causing droplet ejection. Additional layers may also be present, including insulating, semi-conducting, conducting, and/or passivation layers. Such layers may be provided using any suitable fabrication technique such as, for example, a deposition/machining technique, e.g. sputtering, CVD, PECVD, MOCVD, ALD, laser ablation etc. Furthermore, any suitable patterning technique may be used as required, such as photolithographic techniques (e.g. providing a mask during sputtering and/or etching).

The actuating element may, for example, function by deforming a wall bounding one of the fluid chambers of the actuator component. Such deformation may in turn increase the pressure of the fluid within the chamber and thereby cause the ejection of droplets of fluid from the nozzle. Such a wall may be in the form of a membrane layer which may comprise any suitable material, such as, for example, a metal, an alloy, a dielectric material and/or a semiconductor material. Examples of suitable materials include silicon nitride ($Si_3N_4$), silicon oxide ($SiO_2$), aluminium oxide ($Al_2O_3$), titanium oxide ($TiO_2$), silicon (Si) or silicon carbide (SiC). The actuating element may include the ceramic material described herein in the form of a thin film. Such thin films may be fabricated, including in multiple layers, using different techniques well known to the skilled person, including sputtering, sol-gel, chemical solution deposition (CSD), aerosol deposition and pulsed laser deposition techniques.

The droplet deposition apparatus typically comprises a droplet deposition head comprising the actuator component and one or more manifold components that are attached to the actuator component. Such droplet deposition heads may, in addition, or instead, include drive circuitry that is electrically connected to the actuating elements, for example by means of electrical traces provided by the actuator component. Such drive circuitry may supply drive voltage signals to the actuating elements that cause the ejection of droplets from a selected group of fluid chambers, with the selected group changing with changes in input data received by the head.

To meet the material needs of diverse applications, a wide variety of alternative fluids may be deposited by droplet deposition heads as described herein. For instance, a droplet deposition head may eject droplets of ink that may travel to a sheet of paper or card, or to other receiving media, such as textile or foil or shaped articles (e.g. cans, bottles etc.), to form an image, as is the case in inkjet printing applications, where the droplet deposition head may be an inkjet printhead or, more particularly, a drop-on-demand inkjet printhead.

Alternatively, droplets of fluid may be used to build structures, for example electrically active fluids may be deposited onto receiving media such as a circuit board so as to enable prototyping of electrical devices. In another example, polymer containing fluids or molten polymer may be deposited in successive layers so as to produce a prototype model of an object (as in 3D printing). In still other applications, droplet deposition heads might be adapted to deposit droplets of solution containing biological or chemical material onto a receiving medium such as a microarray.

Droplet deposition heads suitable for such alternative fluids may be generally similar in construction to printheads, with some adaptations made to handle the specific fluid in question. Droplet deposition heads which may be employed include drop-on-demand droplet deposition heads. In such heads, the pattern of droplets ejected varies in dependence upon the input data provided to the head.

The present invention will now be described by reference to the following Examples which are intended to be illustrative of the invention and in no way limiting.

EXAMPLES

General Method for the Preparation of Ceramic Materials

Appropriate amounts of $Bi_2O_3$, $TiO_2$, $Na_2CO_3$, $KCO_3$, $SrCO_3$, $ZrO_2$, and $HfO_2$ starting powders of at least 99% purity were utilised to make ceramic materials of a binary solid solution of BNT-BKT or a ceramic material according to formula (I). The starting powders were mixed by means of high energy vibratory milling for a period of two to six hours. Ethanol mixtures of the powders were prepared containing 15 vol. % powder and subsequently milled with high density yttria stabilised zirconia (YSZ) beads of approximately ⅜ inch (0.95 cm) diameter. After removal of YSZ beads by means of a sieving device, calcination was performed on the milled powder in covered crucibles at approximately 800-950° C. for 6 hours. High energy vibratory milling was subsequently used for post-calcination grinding of the powders from two to six hours.

The calcined powders were subsequently mixed with a 3 wt. % solution of polyvinyl butyral (PVB) binder, and the powders were uniaxially cold pressed into 12.7 mm pellets at a pressure of 150 MPa in a Carver press. Following a 400° C. binder burnout step, the pellets/discs were sintered in covered crucibles at 1000-1200° C. for 2 hours. The ceramic discs were polished to thickness of 0.9 mm with smooth and parallel surfaces.

General Methods for Application of Electrodes to the Prepared Ceramic Materials

In a first method, silver paste (Heraeus C1000) was fired on both sides in air at 650° C. for 30 minutes.

In a second method, thin film electrodes of an inert metal such as Au, Ag, or Pt or the ceramic indium tin oxide (ITO) were applied to both sides of the specimen using DC magnetron sputtering in vacuum using standard methods.

Example 1

The above general method was used to prepare various ceramic materials having a composition as indicated in Table 1 below.

TABLE 1

| Ceramic Material | Formula | BNT mol. fraction (x) | BKT mol. fraction (y) | $SrHfO_3$ mol. fraction ($z_1$) | $SrZrO_3$ mol. fraction ($z_2$) |
|---|---|---|---|---|---|
| 1 | BNT-BKT-$SrHfO_3$ | 45 | 45 | 10 | 0 |
| 2 | BNT-BKT-$SrZrO_3$ | 45 | 45 | 0 | 10 |
| 3 | BNT-BKT-$SrHfO_3$—$SrZrO_3$ | 45 | 45 | 5 | 5 |
| 4 | BNT-BKT-$SrHfO_3$—$SrZrO_3$ | 46.5 | 46.5 | 3.75 | 3.75 |
| 5 | BNT-BKT-$SrZrO_3$ | 46.5 | 46.5 | 0 | 7.5 |
| 6 | BNT-BKT-$SrHfO_3$ | 47.5 | 47.5 | 5 | 0 |
| 7 | BNT-BKT-$SrZrO_3$ | 47.5 | 47.5 | 0 | 5 |
| 8 | BNT-BKT-$SrHfO_3$—$SrZrO_3$ | 47.5 | 47.5 | 2.5 | 2.5 |
| 9 | BNT-BKT-$SrZrO_3$ | 48.75 | 48.75 | 0 | 2.5 |
| 10 | BNT-BKT-$SrHfO_3$—$SrZrO_3$ | 48.75 | 48.75 | 1.25 | 1.25 |

Example 2

X-ray diffraction analysis was completed for the ceramic materials prepared in Example 1 using Cu Kα radiation (Bruker AXS D8 Discover, Madison, Wis., USA) on ground pellets and analysed for phase and crystal structure determination. Results in the form of XRD diffractograms are provided in FIGS. 2, 3a-b, 4 and 5a-b. The XRD data reveal a single, homogeneous perovskite phase with pseudo-cubic symmetry as indicated in the Figures.

Example 3

Dielectric properties of the ceramic materials 6 to 8 from Example 1 were measured after the preparation of electrodes in accordance with the general methods set out above. The temperature dependence of relative permittivity and dielectric loss (tan δ) were measured at 1, 10, and 100 kHz using an HP 4194A LCR Meter. The results are presented in FIGS. 6a-c.

Figure 6A:
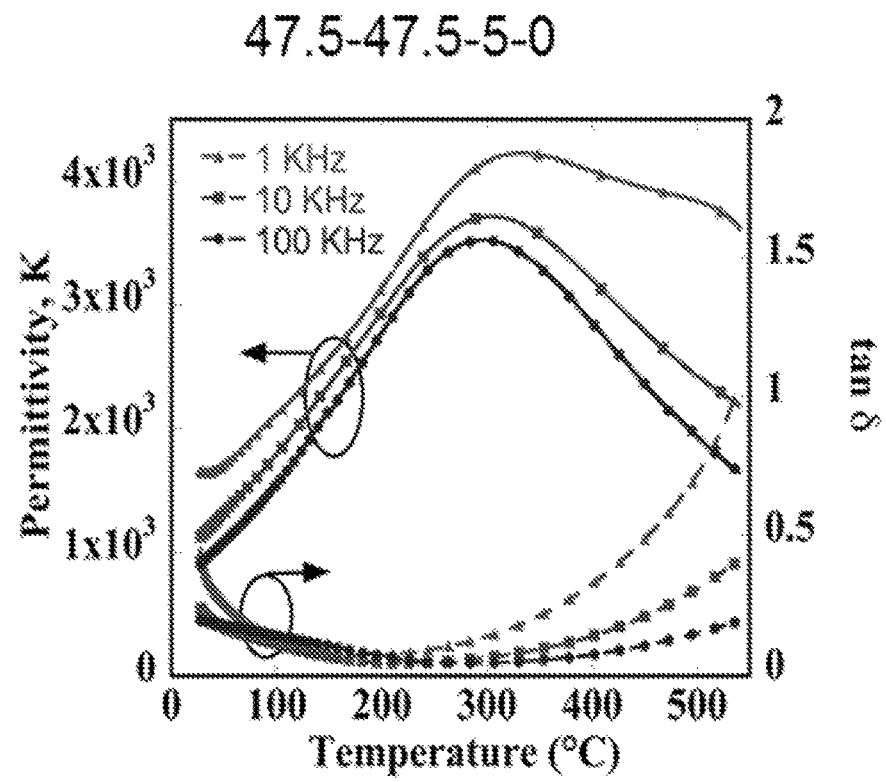
FIGS. 6a-c: show graphs of temperature dependence of relative permittivity and dielectric loss (tan δ) measured at 1, 10, and 100 kHz for BNT-BKT-SrHfO$_3$—SrZrO$_3$ ceramics having mole fractions of: a) 47.5-47.5-5-0; b) 47.5-47.5-0-5; and c) 47.5-47.5-2.5-2.5.
Figure 6B:
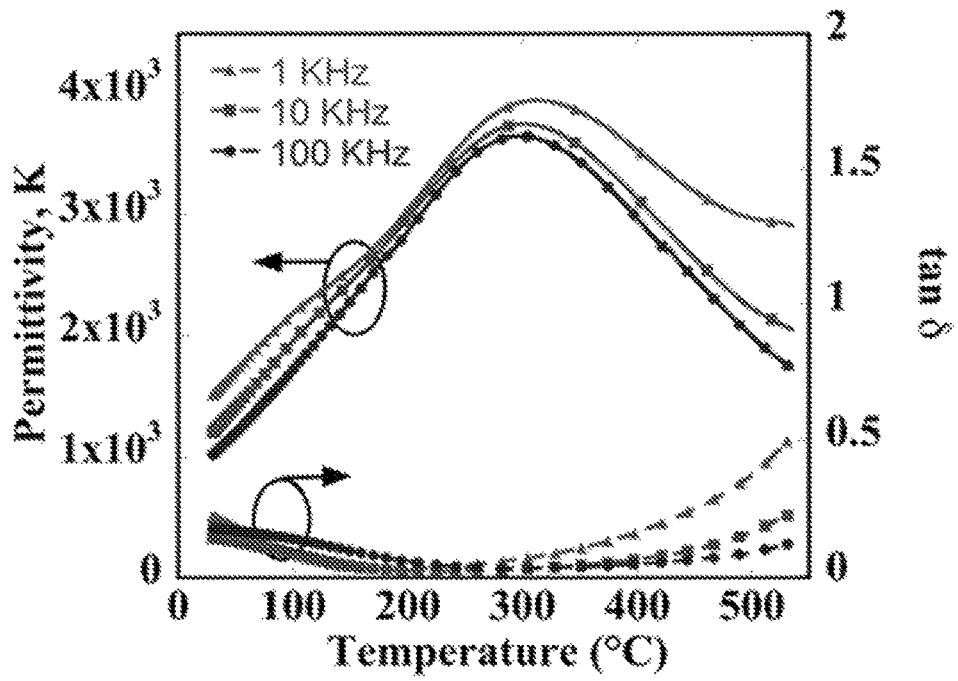
Figure 6C:
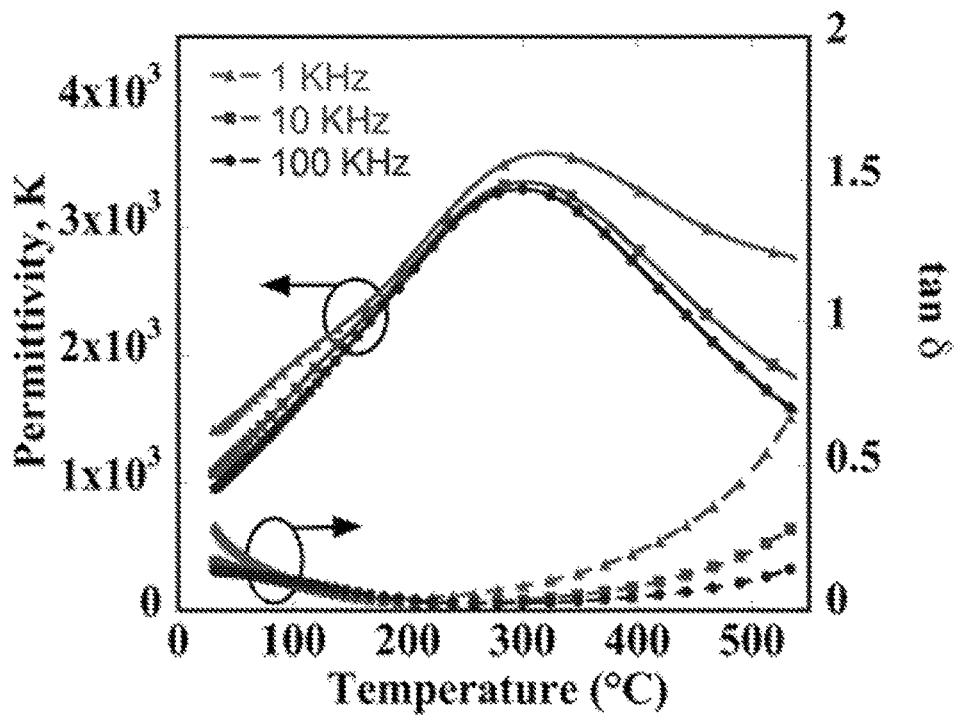
Figure 7A:
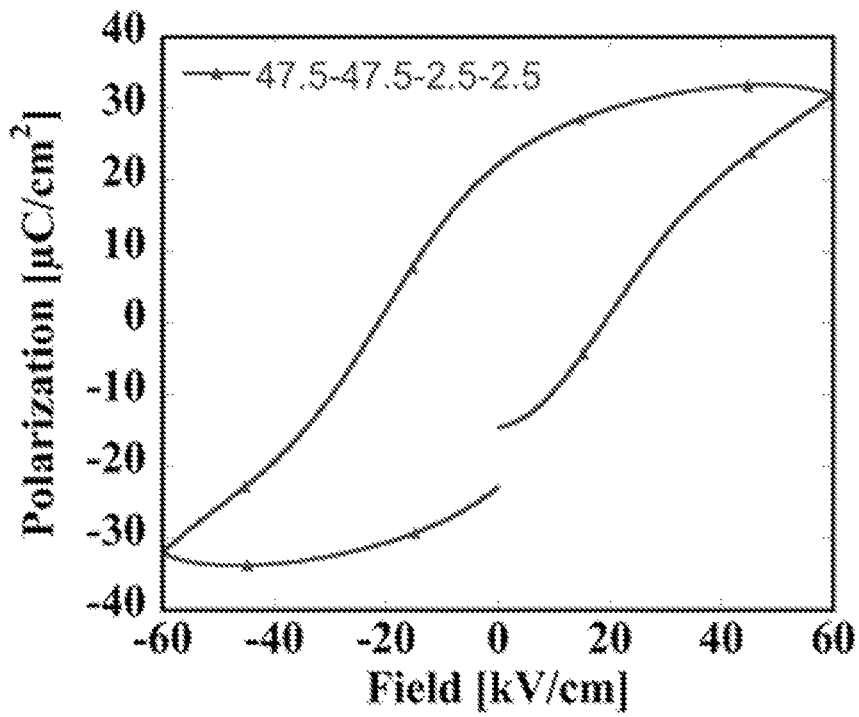
FIGS. 7a-c: show graphs of polarisation measured at 10 Hz and at room temperature (25° C.) versus electric field strength for BNT-BKT-SrHfO$_3$—SrZrO$_3$ ceramics having mole fractions of: a) 47.5-47.5-2.5-2.5; b) 47.5-47.5-5-0; and c) 47.5-47.5-0-5.
Figure 7B:
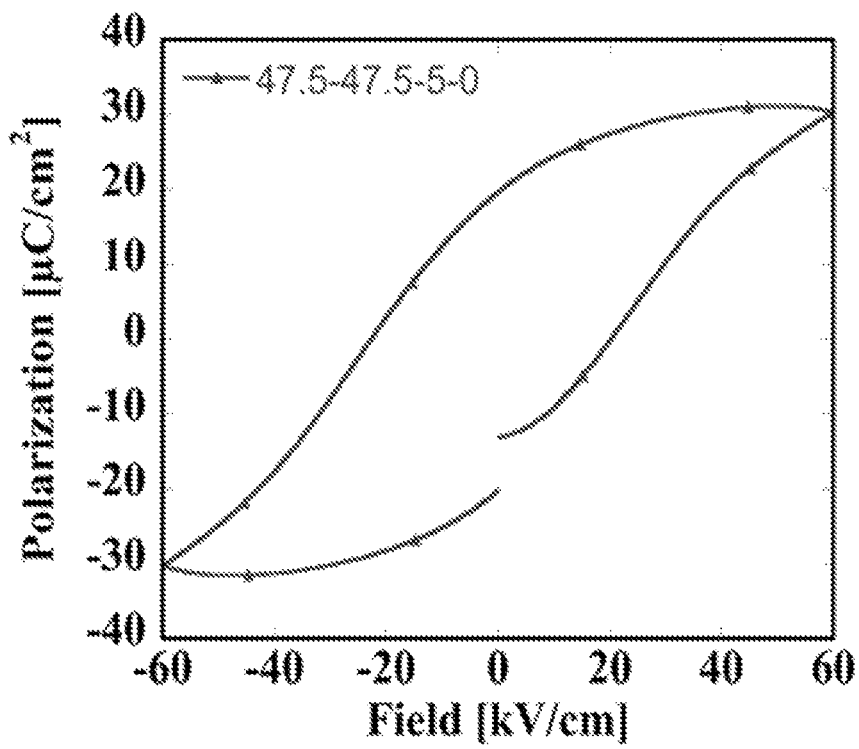
Figure 7C:
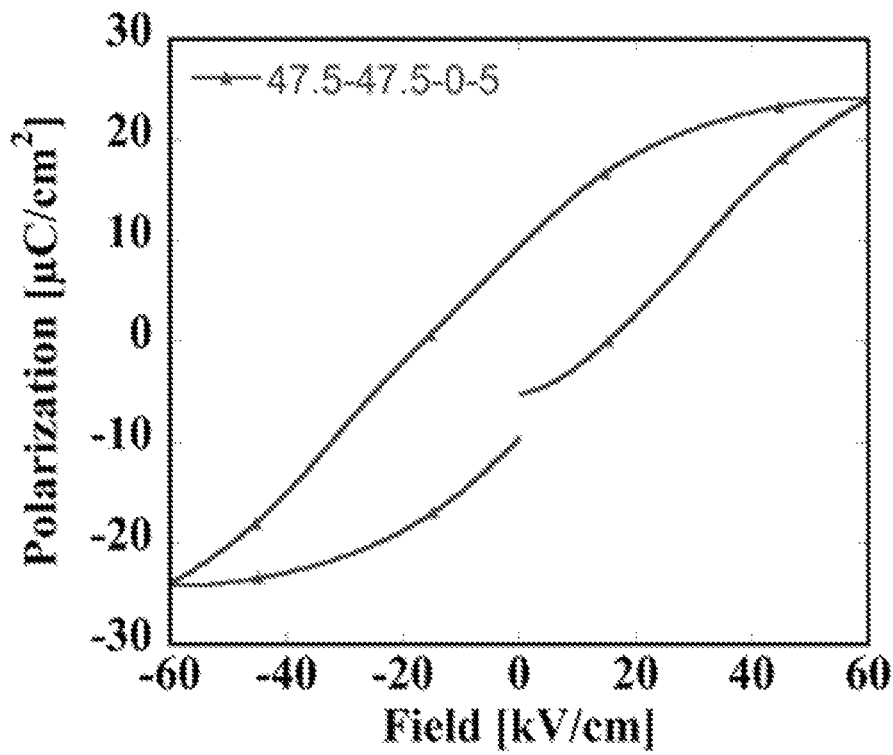

FIGS. 6a-c show a dielectric relaxation at low temperatures (T≤200° C.), and a dielectric maximum at approximately 300° C. ($T_{max}$) The low temperature dielectric relaxation can be attributed to the relaxor nature of the dielectric material. The BNT-BKT-SrHfO$_3$—SrZrO$_3$ ceramic materials are host to multiple cations with dissimilar sizes and electronic structures on the A-site (Bi, Na, K, Sr) and B-site (Ti, Zr, Hf). The dielectric maximum has been attributed to the change in short-range tetragonal distortions due to the local displacement of Ti on the B-site. At temperatures above 300° C. the Ti ion resides in a non-displaced position within the oxygen octahedra.

Example 4

The polarisation hysteresis behaviour of ceramic materials 6 to 8 and 10 from Example 1 were measured after the preparation of electrodes in accordance with the general methods set out above. Polarisation was measured at 10 Hz at room temperature using an AixACCT Piezoelectric Characterization System. The results are presented in FIGS. 7a-c and 9a-b. The data show the characteristic non-linear hysteresis loop with maximum polarisation values between 20 and 30 µC/cm$^2$ and a remanent polarisation approaching zero, consistent with the ceramic material exhibiting relaxor-to-ferroelectric phase transition properties.

Example 5

The electromechanical strain responses for ceramic materials 6 to 8 and 10 from Example 1 were measured after the preparation of electrodes in accordance with the general methods set out above. Electromechanical strain response was measured at 10 Hz at room temperature using an AixACCT Piezoelectric Characterization System fitted with an interferometer. The results are presented in FIGS. 8a-c and 10a-b.

Figure 8A:
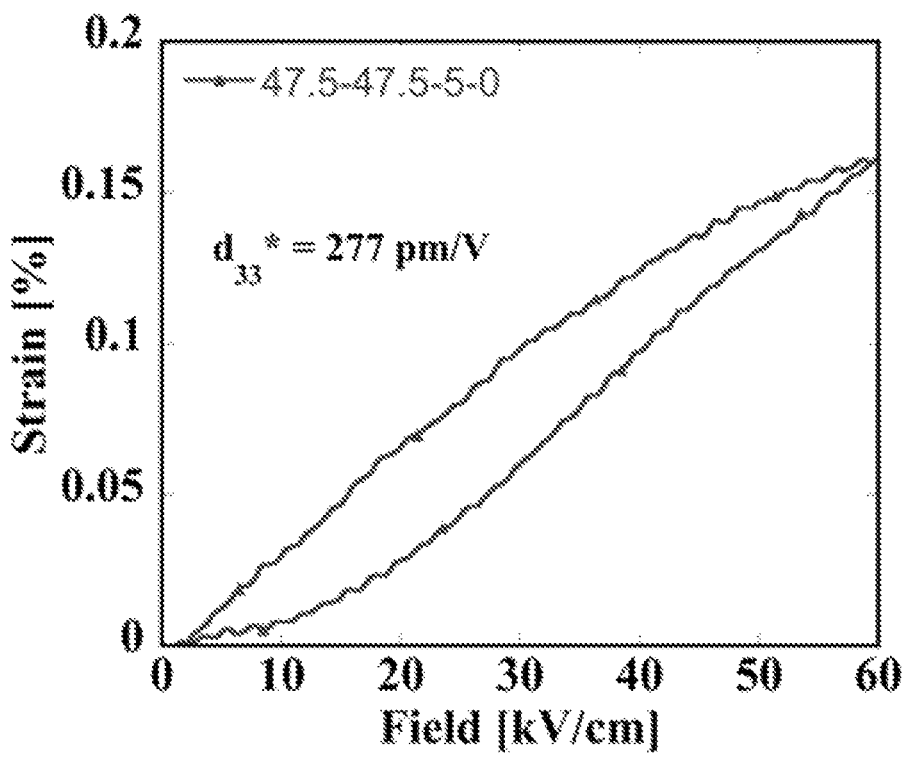
FIGS. 8a-c: show graphs of electromechanical strain measured at 10 Hz and at room temperature versus electric field strength for BNT-BKT-SrHfO$_3$—SrZrO$_3$ ceramics having mole fractions of: a) 47.5-47.5-5-0; b) 47.5-47.5-0-5; and c) 47.5-47.5-2.5-2.5.
Figure 8B:
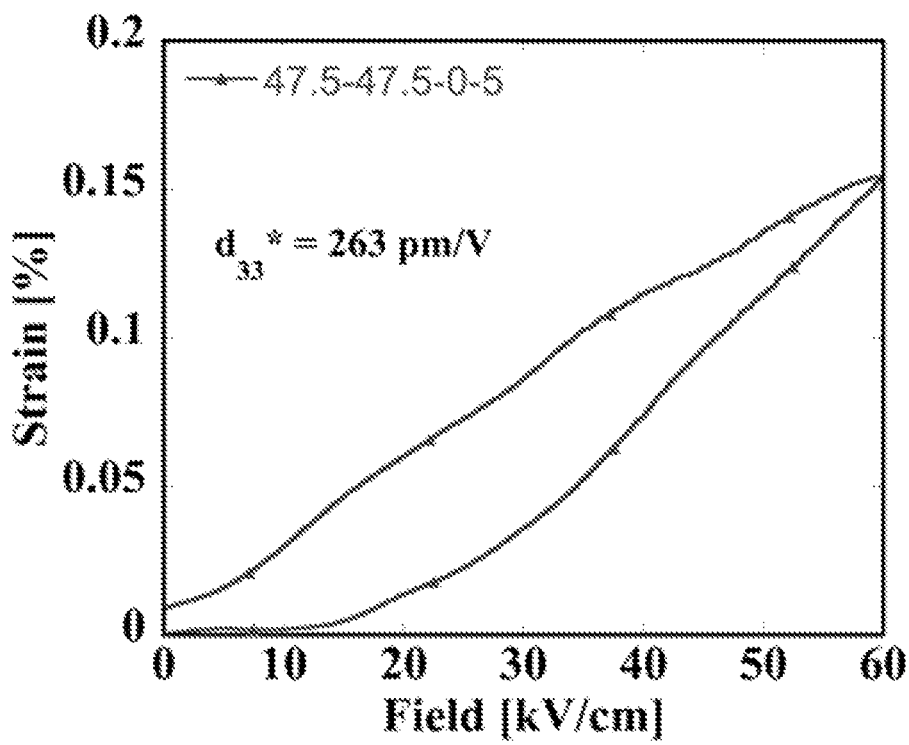
Figure 8C:
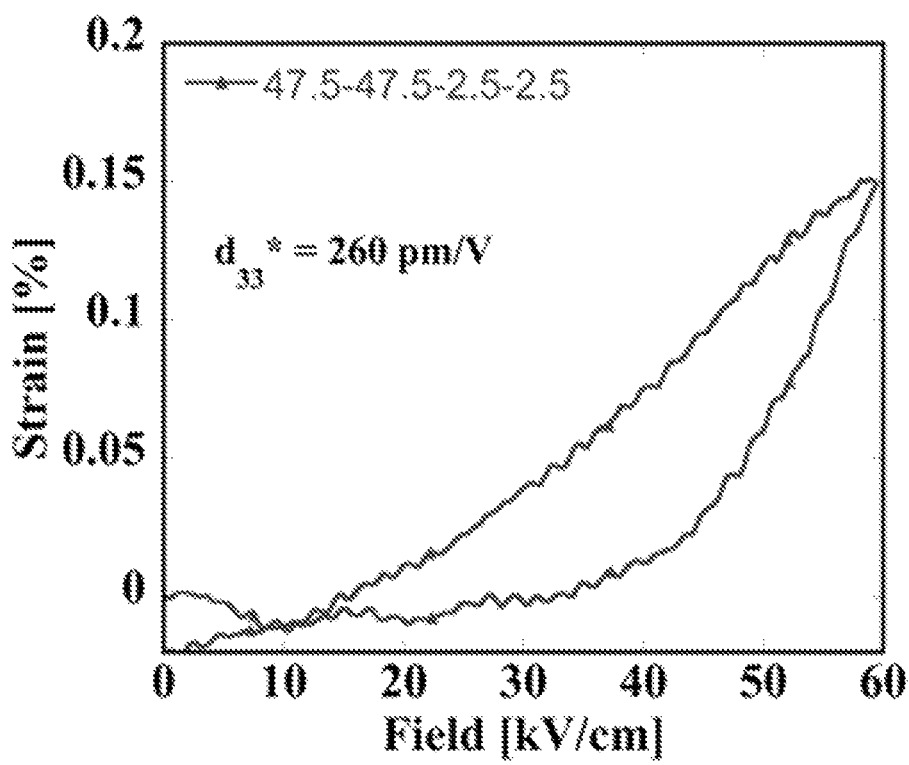
Figure 9A:
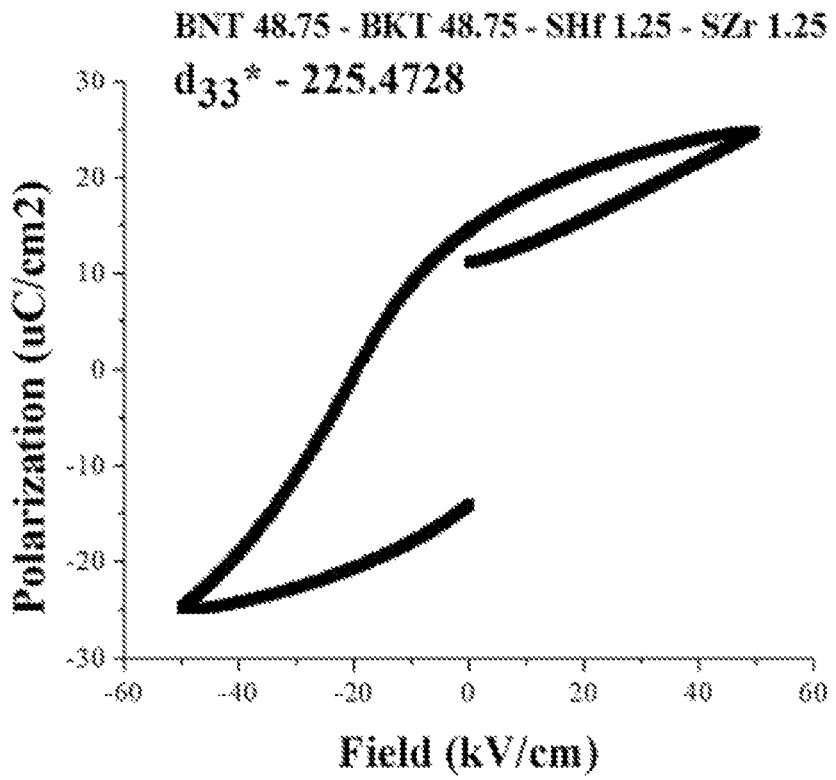
FIGS. 9a-b: show graphs of polarisation measured at 10 Hz and at room temperature versus electric field strength for BNT-BKT-SrHfO$_3$—SrZrO$_3$ ceramics having mole fractions of 48.5-48.5-1.25-1.25.
Figure 9B:
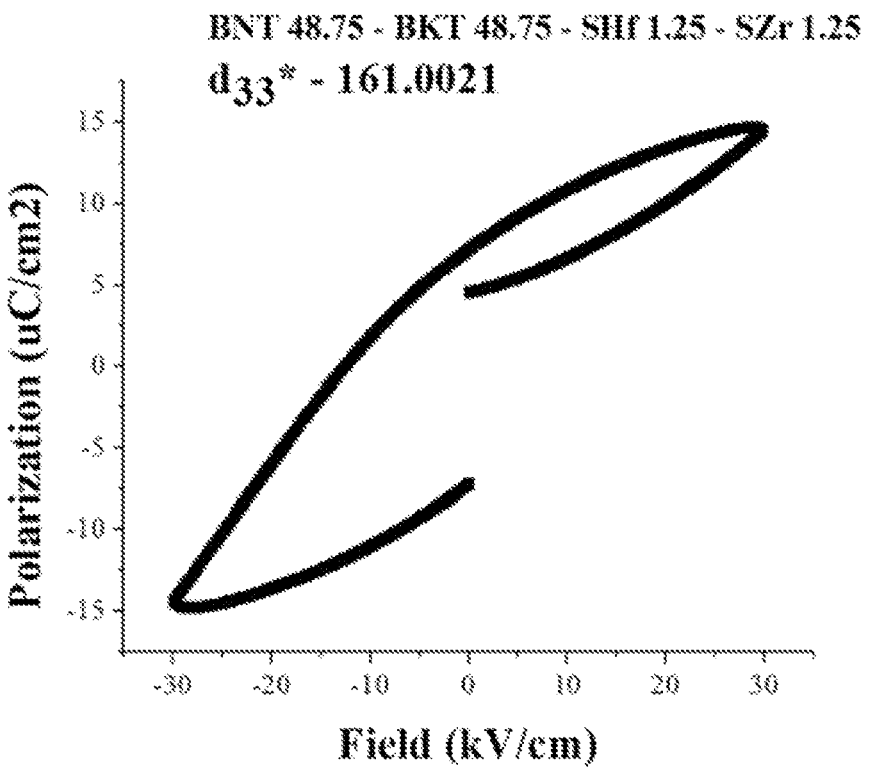
Figure 10A:
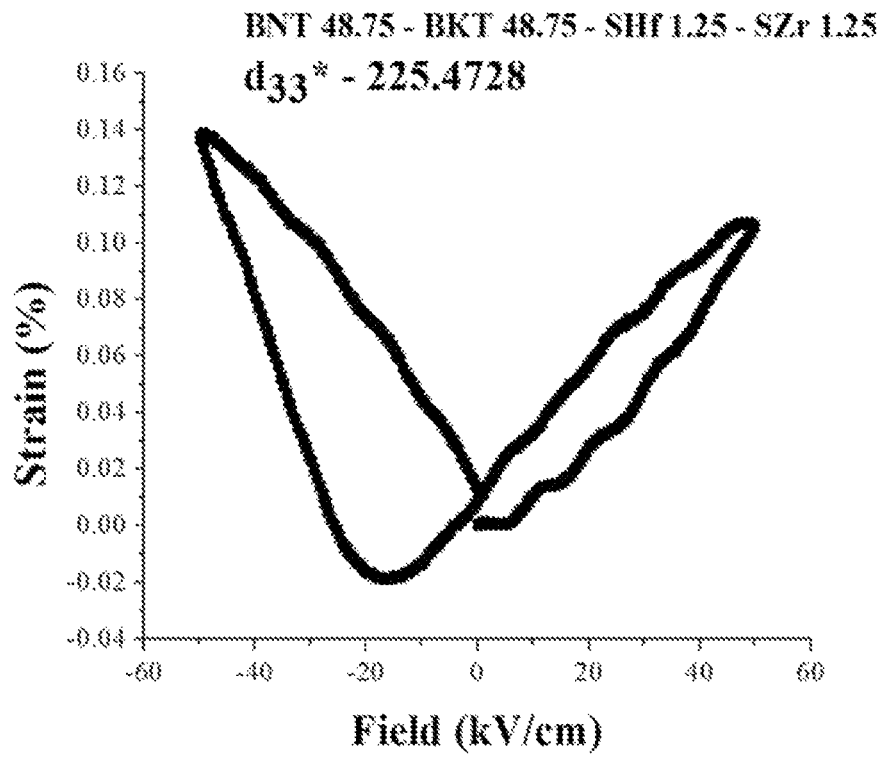
FIGS. 10a-b: show graphs of electromechanical strain measured at 10 Hz and at room temperature versus electric field strength for BNT-BKT-SrHfO$_3$—SrZrO$_3$ ceramics having mole fractions of 48.5-48.5-1.25-1.25.
Figure 10B:
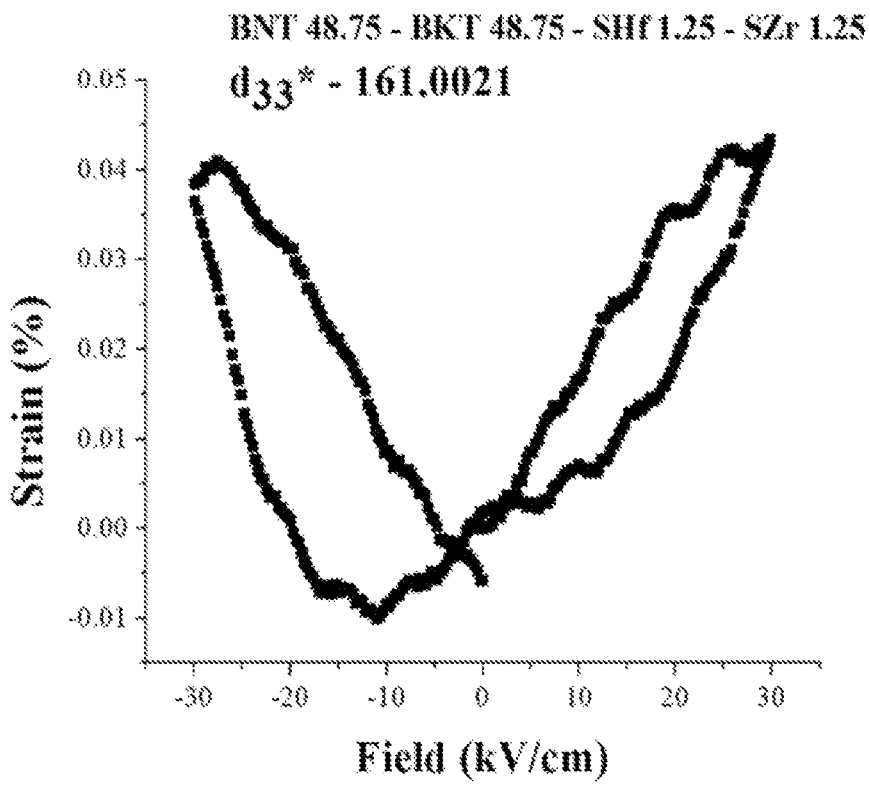

FIGS. 8a-c show maximum strains approaching 0.15% at a maximum electric field of 60 kV/cm. The effective piezoelectric coefficient ($d_{33}$*) for these ceramic materials (corresponding to ceramic materials 6 to 8 from Example 1) calculated from the maximum strain divided by the maximum electric field, had values ranging from 260 to 277 pm/V. The data show a quasi-parabolic strain with a moderate level of hysteresis. Both of these features are characteristic of materials that generate electromechanical strain through a relaxor-to-ferroelectric crossover mechanism. These data demonstrate that these materials are highly suitable for actuator applications.

The invention claimed is:

1. A ceramic material having a chemical formula (I):

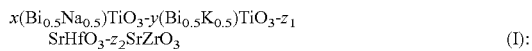

$x(Bi_{0.5}Na_{0.5})TiO_3$-$y(Bi_{0.5}K_{0.5})TiO_3$-$z_1$SrHfO$_3$-$z_2$SrZrO$_3$ (I):

wherein:
$x+y+z_1+z_2=1$;
y and $(z_1+z_2)$ are greater than zero;
$x≥0$; and
the ceramic material comprises at least 70 vol. % of a pseudo-cubic phase having at least one of an axial ratio c/a of from 0.995 to 1.005 or a rhombohedral angle of 90±0.5 degrees and wherein the ceramic material is capable of undergoing a field induced reversible transition from the pseudo-cubic phase to a tetragonal phase having an axial ratio c/a of between 1.005 and 1.02.

2. The ceramic material of claim 1, wherein both $z_1$ and $z_2$ are greater than zero.

3. The ceramic material of claim 1, wherein 0.25≤x≤0.65.

4. The ceramic material of claim 1, wherein 0.25≤y≤0.75.

5. The ceramic material of claim 1, wherein 0.01≤($z_1$+$z_2$)≤0.15.

6. The ceramic material of claim 1, wherein:
0.40≤x≤0.50;
0.40≤y≤0.50; and
0.02≤($z_1$+$z_2$)≤0.10.

7. The ceramic material of claim 1, wherein x=0.

8. The ceramic material of claim 7, wherein 0.75≤y≤0.99.

9. The ceramic material of claim 7, wherein 0.01≤($z_1$+$z_2$)≤0.25.

10. The ceramic material of claim 1, wherein the ceramic material has a remnant polarization of less than 5 µC/cm$^2$.

11. The ceramic material of claim 1, wherein the ceramic material has an effective piezoelectric strain coefficient $d_{33}$* of from 50 to 500 pm/V.

12. The ceramic material of claim 1, wherein the ceramic material has a maximum electromechanical strain value of from 0.1% to 0.5%, when measured at 10 Hz and at standard temperature and pressure.

13. The ceramic material of claim 1, wherein the ceramic material has a field induced polarization of from 10 to 50 µC/cm$^2$.

14. The ceramic material of claim 1, wherein the ceramic material is configured to be reversibly converted into a ceramic material comprising at least 50 vol. % of a tetragonal phase, when applying an electric field to the ceramic material.

15. The ceramic material according to claim 14, wherein the tetragonal phase has an axial ratio c/a of between 1.01 and 1.02.

16. A method of preparing a ceramic material comprising:
mixing precursors of a ceramic material in predetermined molar ratios, the ceramic material having chemical formula of $x(Bi_{0.5}Na_{0.5})TiO_3$-$y(Bi_{0.5}K_{0.5})TiO_3$-$z_1$SrHfO$_3$-$z_2$SrZrO$_3$; and
utilizing the mixture of precursors in solid-state synthesis to prepare the ceramic material,
wherein:
$x+y+z1+z2=1$;
y and $(z1+z2)$ are greater than zero;
x is greater than or equal to zero;
the ceramic material comprises at least 70 vol. % of a pseudo-cubic phase having at least one of an axial ratio c/a of from 0.995 to 1.005 or a rhombohedral angle of 90±0.5 degrees and wherein the ceramic material is capable of undergoing a field induced reversible transition from the pseudo-cubic phase to a tetragonal phase having an axial ratio c/a of between 1.005 and 1.02; and
the predetermined molar ratios of precursors are determined based on:
the molar ratio of (Bi$_{0.5}$Na$_{0.5}$)TiO$_3$ precursors to (Bi$_{0.5}$K$_{0.5}$)TiO$_3$ precursors required to form a tetragonal phase; and
the molar ratio of at least one of SrHfO$_3$ precursors or SrZrO$_3$ precursors to (Bi$_{0.5}$Na$_{0.5}$)TiO$_3$ and (Bi$_{0.5}$K$_{0.5}$)TiO$_3$ precursors required to form the ceramic material which comprises a major proportion of the pseudo-cubic phase.

17. The method according to claim 16, wherein a binary $(Bi_{0.5}Na_{0.5})TiO_3$—$(Bi_{0.5}K_{0.5})TiO_3$ composition comprises a tetragonal phase having an axial ratio c/a of between 1.01 and 1.02.

18. The method according to claim 16 wherein x=0.

19. An actuator for a droplet deposition apparatus comprising:
- a ceramic material having a chemical formula of $x(Bi_{0.5}Na_{0.5})TiO_3$-$v(Bi_{0.5}K_{0.5})TiO_3$-$z_1 SrHfO_3$-$z_2SrZrO_3$;
- an actuating element configured to cause an ejection of fluid from a chamber;
- a first electrode adjacent to the ceramic material; and
- a second electrode adjacent to the ceramic material wherein:
- $x+y+z_1+z_2=1$;
- y and (z1+z2) are greater than zero;
- $x \geq 0$;
- the ceramic material comprises at least 70 vol. % of a pseudo-cubic phase having at least one of an axial ratio c/a of from 0.995 to 1.005 or a rhombohedral angle of 90±0.5 degrees and wherein the ceramic material is capable of undergoing a field induced reversible transition from the pseudo-cubic phase to a tetragonal phase having an axial ratio c/a of between 1.005 and 1.02; and
- the first electrode and the second electrode are configured to apply an electric field to the ceramic material to cause the ejection.

\* \* \* \* \*